(12) United States Patent
Corbin et al.

(10) Patent No.: US 9,384,881 B2
(45) Date of Patent: Jul. 5, 2016

(54) BALANCED MAGNETIC ARRAY

(71) Applicant: Apple Inc., Cupertino, CA (US)

(72) Inventors: Sean S. Corbin, San Jose, CA (US);
Samuel Gilkison Smith, Cupertino, CA (US); Richard D. Kosoglow, Sunnyvale, CA (US); James A. Stryker, Mountain View, CA (US); Hao Zhu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 47 days.

(21) Appl. No.: 14/491,583

(22) Filed: Sep. 19, 2014

(65) Prior Publication Data

US 2016/0086708 A1    Mar. 24, 2016

Related U.S. Application Data

(63) Continuation of application No. PCT/US2014/056462, filed on Sep. 19, 2014.

(51) Int. Cl.
| H01F 7/00 | (2006.01) |
| H01F 7/02 | (2006.01) |
| G01R 33/00 | (2006.01) |
| G06F 1/16 | (2006.01) |

(52) U.S. Cl.
CPC .......... *H01F 7/0278* (2013.01); *G01R 33/0052* (2013.01); *G06F 1/1656* (2013.01)

(58) Field of Classification Search
CPC ....................................................... B65D 85/00
USPC ........................................................ 335/296
See application file for complete search history.

(56) References Cited

U.S. PATENT DOCUMENTS

| 4,751,516 A | 6/1988 | Lichtblau |
| 5,471,140 A | 11/1995 | Hanley |
| 2004/0066194 A1 | 4/2004 | Slade et al. |
| 2004/0175551 A1* | 9/2004 | Dunlop ................. B05D 5/066 428/212 |
| 2009/0309114 A1* | 12/2009 | Lu ......................... H01L 33/505 257/98 |
| 2010/0148969 A1 | 6/2010 | Lian et al. |
| 2012/0261711 A1* | 10/2012 | Brown ..................... H01L 33/62 257/99 |
| 2013/0140203 A1 | 6/2013 | Chiang |
| 2013/0233762 A1* | 9/2013 | Balaji ........................ G06F 1/16 206/736 |
| 2013/0328825 A1* | 12/2013 | Brown ..................... G06F 3/01 345/174 |
| 2014/0043121 A1* | 2/2014 | Sartee ....................... G06F 1/16 335/219 |
| 2014/0097835 A1* | 4/2014 | Sartee ..................... G01R 33/07 324/251 |

(Continued)

OTHER PUBLICATIONS

PCT Application No. PCT/US2014/056462—International Search Report and Written Opinion dated Jun. 19, 2015.

*Primary Examiner* — Shawki S Ismail
*Assistant Examiner* — Lisa Homza
(74) *Attorney, Agent, or Firm* — Downey Brand LLP

(57) ABSTRACT

A balanced magnetic string and methods for forming same are described. The balanced magnetic string includes at least a plurality of magnetic elements linearly arranged in an alternating magnetic polarity pattern and each comprising a first magnetic volume and a compensating magnetic element having a second magnetic volume that is different than the first magnetic volume. The plurality of magnetic elements and the compensating magnetic element magnetically interact to provide a resultant magnetic field having a desired magnetic field strength at a point of interest.

11 Claims, 8 Drawing Sheets

(56) References Cited

U.S. PATENT DOCUMENTS

| | | | |
|---|---|---|---|
| 2014/0147987 A1* | 5/2014 | Zhao | H01L 33/0079 438/458 |
| 2014/0253284 A1* | 9/2014 | Peterson | H04M 1/185 340/3.1 |
| 2015/0049426 A1* | 2/2015 | Smith | A45C 11/00 361/679.27 |
| 2015/0078299 A1* | 3/2015 | Barriac | H04W 74/006 370/329 |
| 2015/0264689 A1* | 9/2015 | Sampath | H04W 72/0453 370/329 |

* cited by examiner

BALANCED MAGNETIC ARRAY

CROSS-REFERENCE TO RELATED APPLICATIONS

This application is a continuation of International Application No. PCT/US2014/56462 with an international filing date of Sep. 19, 2014, entitled "BALANCED MAGNETIC ARRAY", which is incorporated herein by reference in its entirety.

FIELD

The described embodiments generally relate to magnetic arrays. More specifically, magnetic arrays having a selected magnetic field distribution.

BACKGROUND

Conventional attachment mechanisms such as mechanical fasteners, clasps, and so forth typically require an externally accessible attaching feature on the electronic device to mate with a corresponding attaching feature on the accessory device. This arrangement can detract from the overall look and feel of the handheld computing device as well as add unwanted weight and complexity as well as degrade the appearance of the hand held computing device.

SUMMARY

This paper describes various embodiments that relate to a system, method, and apparatus for releasably attaching an accessory to an electronic device.

A method for forming a balanced magnetic array having m magnetic elements such that the balanced magnetic array provides a resultant magnetic field having a desired magnetic field property (such as magnetic field strength) with respect to a point of interest P is described. The method includes the following steps: identifying a location in the magnetic array corresponding to a compensating magnetic element, determining a magnetic property of the compensating magnetic element such that a magnetic interaction between the compensating magnetic element and the m−1 other magnetic elements in the magnetic array provides the resultant magnetic field, and populating the identified location with the compensating magnetic element.

A balanced magnetic array having m magnetic elements of which m−1 magnetic elements each have a magnetic volume $V_m$ and an $m^{th}$ magnetic element having a corresponding magnetic property such that a magnetic interaction between the $m^{th}$ magnetic element and the m−1 other magnetic elements in the magnetic array provides a resultant magnetic field having a desired magnetic property at a point of interest.

Non-transitory computer readable medium for forming a balanced magnetic array having m magnetic elements such that the balanced magnetic array provides a resultant magnetic field having a desired magnetic field strength H with respect to a point of interest P includes at least: computer code for identifying a location in the magnetic array corresponding to a compensating magnetic element, computer code for determining a magnetic property of the compensating magnetic element such that a magnetic interaction between the compensating magnetic element and the m−1 other magnetic elements in the magnetic array provides the resultant magnetic field, and computer code for causing the identified location to be populated with the compensating magnetic element.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION

Figure 1:
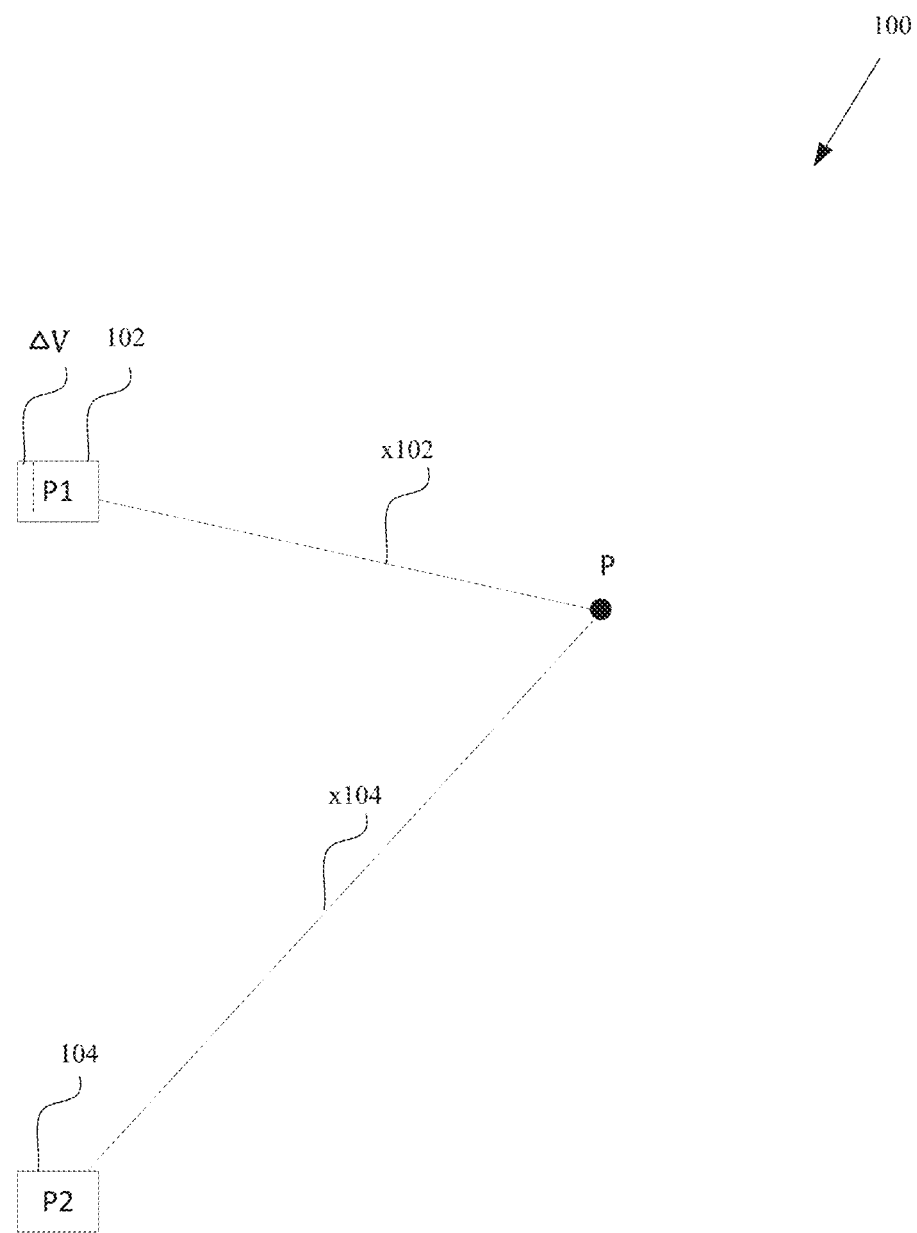
FIG. 1 shows of magnetic pair in accordance with the described embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following description relates in general to a mechanism that can be used to attach together at least two suitably configured objects. In one embodiment, this can be accomplished without the use of conventional fasteners. Each of the objects can include an attachment feature arranged to provide a magnetic field having appropriate properties. When the attachment features are brought into proximity with each other, the magnetic fields can cooperatively interact based upon their respective properties, result in the objects magnetically attaching to each other in a desired and repeatable manner. For example, due at least in part to the cooperative nature of the interaction of the magnetic fields, the objects can attach to each other in a pre-determined position and relative orientation without external intervention. For example, the cooperative magnetic interaction can result in the objects self-aligning and self-centering in a desired orientation.

The objects can take many forms and perform many functions. In one embodiment, at least one object can be used as an accessory device. The accessory device can be magnetically attached to at least one electronic device having a relatively large display in proportion to the overall size of the electronic device (a tablet device is one example). The accessory device can provide services and functions that can be used to enhance the operability of the electronic device. For example, the accessory device can take the form of a protective cover that can be magnetically attached to the electronic device. The protective cover can provide protection to certain aspects (such as a display) of the electronic device while enhancing the overall look and feel of the electronic device.

In some embodiments, magnets can be used as a basis for forming a releasable attachment between the accessory device and for example, a consumer electronic product such as a tablet device. However, when using magnets in consumer electronic products, a designer is often tasked with maximizing magnetic attraction force while limiting magnetic field(s) at a point of interest which may cause unwanted effects upon magnetically sensitive circuits or devices such as credit card that using magnetic stripe for identification. Moreover, with regards to magnetically sensitive circuits such as a magnetometer that can be used as, for example, a magnetic compass, maintaining a constant and a well-defined magnetic field can be important. However, limiting the magnetic surface strength can reduce the magnetic field strength of the magnets that can have the unwelcome effect of reducing the overall ability of the magnets to maintain a secure magnetic attachment. Moreover, limiting the surface magnetic field generally limits a maximum intensity of magnetic strength at any given point thereby pushing the designer to use a greater surface area of magnetic material. Furthermore, limiting the surface magnetic field at the point of interest (corresponding to a magnetic compass, for example) has the result of forcing placement of the magnets further away from the point of interest thereby reducing the surface made available for the designer.

The following describes techniques, apparatus and system for maximizing a magnetic attractive force from an array of magnets that have been balanced in such as way that a magnetic field at a desired location (that can correspond to that of a magnetically sensitive component, such as a magnetic compass) can be set at a desired value. In some cases, the magnetic field at the location can be essentially a null magnetic field by which it is meant that magnetic fields at the location have been balanced such that a net magnetic field is about zero. In this way, by using the described magnetic balancing techniques and apparatuses, the designer can use surfaces heretofore unavailable due to concerns related to disruption of sensitive magnetic components, such as a magnetic compass.

A magnetic field strength of a magnetic element is generally proportional to an amount (corresponding to a volume or mass) of magnetic material, and a corresponding a magnet material strength (also referred to as magnetic dipole moment) and magnetic polarity that can be referred to as a North pole or a South pole. Using the magnetic pole model, near the North pole, for example, all magnetic field lines point away from the North pole (whether inside the magnet or out) while near the South pole (whether inside the magnet or out) all magnetic field lines point toward the South pole. A North pole, then, feels a force in the direction of the magnetic field while the force on the South pole is opposite to the magnetic field. In the magnetic pole model, the elementary magnetic dipole is formed by two opposite magnetic poles of pole strength $q_m$ separated by a very small distance vector d, such that $m=q_m d$. Using this model, magnetic poles cannot exist apart and always come in North/South pairs; if a magnetized object is divided in half, a new pole will appear on the surface of each piece so each will have a pair of complementary poles.

Moreover, the magnetic element can be mathematically analogized as a magnetic element having a centroid of mass and characterized as having a magnetization vector having a magnetic field strength component that generally varies as an inverse cube of a distance from the magnetic element and a direction component defined (by convention) of increasing magnetic field strength. Accordingly, a net magnetic field at a particular location can be calculated using by vector addition that can be simplified to linear addition (also referred to as superposition) of the various magnetization vectors of each relevant constituent magnetic element. In this way, by superposing the various magnetization vectors, a desired net magnetic field at a particular point can be calculated. Moreover, by varying the polarity(ies), magnetic strengths of the constituent magnetic elements and their relative locations with respect to a particular location, the desired magnetic field at that location can be achieved. In a particular embodiment, the magnetic elements can be arranged as an array of magnets each having substantially the same size and configuration.

In one arrangement, the array of magnets can be arranged in such a way that the individual magnetic elements can be arranged in an alternating magnetic polarity pattern (P1, P2, P1, P2 . . . ; where P1 represents a first polarity such as North and P2 an second polarity opposite that of P1 such as South). In a specific embodiment, the magnetic array can take the form of a one-dimensional array, or string, in which the individual magnetic elements are arranged in a linear manner. In some cases, the individual magnetic elements can be about equally spaced apart. In other cases, however, the spacing between the individual magnetic elements can vary. In some cases, the individual magnetic elements can be characterized as having about the same size, shape and mass. In other cases, the individual magnetic elements can vary in size, shape and mass or any combination thereof.

Without loss of generality, the following describes a linear magnetic array, or string, that can be magnetically balanced in such a way as to provide a predicted net magnetic field at a specific location. Analytically, the balancing of the magnetic string can be accomplished using the aforementioned superposition of the magnetization vectors of each of the magnetic elements of the magnetic string. In one embodiment, the geometric relationship (i.e., the distances and directions between the constituent magnetic elements and a location corresponding to, for example, a magnetometer used as a magnetic compass in a consumer electronic product) can be determined by design considerations and can therefore be excluded from the analysis since they are essentially constant with respect to the desired location. Therefore, the net magnetic field at the desired location can determined by the superposition of the magnetic elements using only the magnetic property of magnetic field strength of single (or more if needed) magnetic element. Since magnetic field strength of the magnetic element is related to the amount of magnetic material and the intrinsic magnetic strength of the magnetic material, the magnetic field at the desired location can be directly related to a volume of magnetic material associated with an individual magnetic element. In this way, the magnetic field at the desired location can be varied (or tuned) in accordance with a relative amount of magnetic material (or volume or shape) and magnetic polarity of the individual magnetic element with respect to the other magnetic elements in the magnetic string.

It should be noted, however, that a magnetic interaction between magnetic strings can result in a modulating (varying) magnetic field at a point of interest even though each side of the magnetic interaction results in a static magnetic field at the point of interest. However, by balancing both sides of the interacting magnetic strings in the manner described above to a null field at the point of interest, a magnetic field having desired properties (such as a null magnetic field) can be maintained since any gain or attenuation between the magnetic fields of the two magnetic strings will offset each other because any attenuation or gain will be multiplied by "0" (null) and remain equal to "0". This approach can also be applied with multiple magnets by modulation of the sizes of the magnetization regions.

Furthermore, these techniques can be used to concurrently balance a magnetic string at multiple points by balancing the magnetic string for one point using the magnetic element that is located closet to a first point of interest and balance the string for a second point of interest using the magnetic element closest to the second point of interest. This process can be iterative in nature until a desired minimum error is achieved, the error being a difference between a desired magnetic property of each of the magnetic elements at the desired points of interest.

Another approach can be used to balance a magnetic string that includes more magnetic elements than could be accounted for using the single magnetic element approach. When confronted with such a (long) magnetic string, the long magnetic string can be balance in a piecemeal fashion at multiple points along the string. In this way, the effect of tolerances on the balancing can be substantially reduced. This technique can also be applied to non-linear (curved) or three-dimensional magnetic structures.

With regards to devices having magnetic sensing circuits (such as a Hall Effect sensor, a magnetometer, etc.), this approach can be used to balance a magnetic structure (such as the magnetic string) in such a way that the magnetic strings do not substantially interact with each other thereby eliminating any issues related to cross talk. In this way, with less crosstalk, the circuits can operate with greater magnetic sensing resolution than would otherwise be possible or, the circuits can be placed in greater proximity to one another with the same sensing resolution.

In general, the described embodiments advantageously provide use of more magnetic material, in closer proximity to a magnetically sensitive component, without unwanted magnetic interactions with same. Moreover, larger amounts of magnetic material (or use of inherently stronger magnetic material) added with the ability of situated these magnetic materials in closer proximity to magnetic sensitive components without deleterious effects, allows for greater magnetic interaction forces and/or sensing resolution.

A magnetic element, such as a permanent magnet, can be formed of magnetic material capable of providing a magnetic field having magnetic field strength H that is generally proportional to an amount of the magnetic material associated with the magnetic element. Since the ratio of mass (M) to volume (V) is equal to density ($\rho$) in accordance with Eq. (1):

$$\rho = M/V,  \quad \text{Eq. (1)}$$

volume V can be used as a proxy for the mass of the magnetic element as shown by Eq. (2):

$$V \propto M. \quad \text{Eq. (2)}$$

Using the fact that the magnetic strength H(x) varies in accordance with an inverse cube of the distance x from the magnetic element in combination with Eq. (2) results in Eq. (3) that describes a general relationship between magnetic volume (V), magnetic strength (S), and a three dimensional magnetic direction vector (D):

$$H(x) \propto V \times S \times D/x^3. \quad \text{Eq. (3)}$$

It should be noted that Eq. (4)-(8) described systems in which the magnetic elements are arranged in an alternating magnetic pattern and formed of a single magnetic material. Again, a more general relationship can be derived for magnetic elements of more than a single magnetic material and non-alternating polarity patterns using the principal of superposition.

In a case of a single magnetic pair formed of two magnetic elements each located a distance $x_1$ and $x_2$ from arbitrary point $P_0$, and using Eq. (3), magnetic field strength $H_1(x)$ and $H_2(x)$ associated with each magnetic element is described by Eqs. (4) and (5), respectively:

$$H_1(x) \propto (V_1/x_1^3) \quad \text{Eq. (4)}$$

$$H_2(x) \propto (V_2/x_2^3) \quad \text{Eq. (5)}$$

The net magnetic strength $H(P_0)$ from the two magnetic elements can be derived by adding $H_1$ and $H_2$ using the principle of superposition in accordance with Eq. (6):

$$H(P_0) = (H_1(x) + H^2(x)) \propto (V_1/x_1^3 + V_2/x_2^3) \quad \text{Eq. (6)}$$

In those situations where a desired net magnetic strength at arbitrary point $P_0$ is null (i.e., $H(P_0)=0$), then $H_1 = -H_2$ resulting in Eq. (7):

$$V_2 = V_1(x_2^3/x_1^3) \quad \text{Eq. (7)}$$

It should be noted that Eq. (6) and (7) can be generalized to a magnetic string of arbitrary length that includes m magnetic elements. Accordingly, for a magnetic string having m magnetic elements arranged in an alternating magnetic polarity pattern, Eq. (6) becomes Eq. (8):

$$H_0 = V_m/D_m^3 + \Sigma_1^{m-1} \pm V_i/D_i^3 \quad \text{Eq. (8)}$$

where:
  $V_i$ represents volume V for the m−1 magnetic elements of the magnetic string, and
  $x_i$ represents distance between each of the m−1$^{th}$ magnetic elements of the magnetic string and arbitrary point $P_0$;
  $V_m$ represents volume V for a compensating magnetic element that in this case is the last (m$^{th}$) magnetic element of the magnetic string, and
  $x_m$ represents distance between the (closest to $P_0$) m$^{th}$ magnetic element of the magnetic string and arbitrary point $P_0$.

By setting the $H_0$ to zero, Eq. (8) reduces to what can be referred to as a magnetic string tuning equation or relationship:

$$0 = V_m/x_m^3 + \Sigma_1^{m-1} \pm V_i/x_i^3. \quad \text{Eq. (9)}$$

As above, a more general relationship can be derived for magnetic elements of more than a single magnetic material and non-alternating polarity patterns using the principal of superposition in accordance with Eq. (10):

$$H_0 = V_m S_m D_m/x_m^3 + \Sigma_1^{m-1} V_m S_m D_m/x_1^3 \quad \text{Eq. (10)}$$

Accordingly, in one embodiment, by modifying the size of a compensating magnetic element (that can be, for example, the element closest to the point of interest) in the string, the magnetic effect of string elements 1 . . . (m−1) can be balanced. In this way, the magnetic field at location P(0) can be varied (or tuned) in accordance with a magnetic property of a compensating magnetic element. In one embodiment, the magnetic property can be a relative amount of magnetic material and/or a magnetic polarity of a compensating magnetic element with respect to the other magnetic elements in the magnetic string.

FIG. 1 shows of magnetic pair 100 in accordance with the described embodiments and more specifically an analytical approach to magnetic balancing based upon Eq. (7). Magnetic pair 100 can include magnetic element 102 having magnetic volume $V_{102}$ located distance $x_{102}$ from point P and magnetic polarity $P_1$. Magnetic pair 102 can also include magnetic element 104 having magnetic volume $V_{104}$ located distance $x_{104}$ from point P and having magnetic polarity $P_2$ that is opposite to that of magnetic element 102. As described above, magnetic field strength $H_1(P)$ at point P can set to null (i.e., $H_1(P)=0$) by adjusting the relationship between magnetic volumes $V_{102}$ and $V_{104}$ in accordance with Eq. (7) and more specifically for magnetic pair 100 as Eq. (11):

$$V_{104}=V_{102}(x_{104}^3/x_{102}^3) \qquad \text{Eq. (11)}$$

It should be noted that these techniques allow the closest magnet to the point of interest to be closer, so it could be considered as adding dual source balancing and attracting magnets rather than removing magnetic material.

It should be noted that the relationship described by Eq. (11) presumes that magnetic elements 102 and 104 magnetically interact equally and are of opposite magnetic polarities. Therefore, since $x_{104}$ is less than $x_{102}$, magnetic volume $V_{104}$ is reduced by amount $\Delta V_{104}$ compared to the other magnetic elements and corresponding to a reduction in magnetic material M in accordance with Eq. (1). In this way, by adjusting the amount of magnetic material associated with magnetic element 104, magnetic field strength $H_1$ (P) at point P can be set to a null magnetic field.

Figure 2:
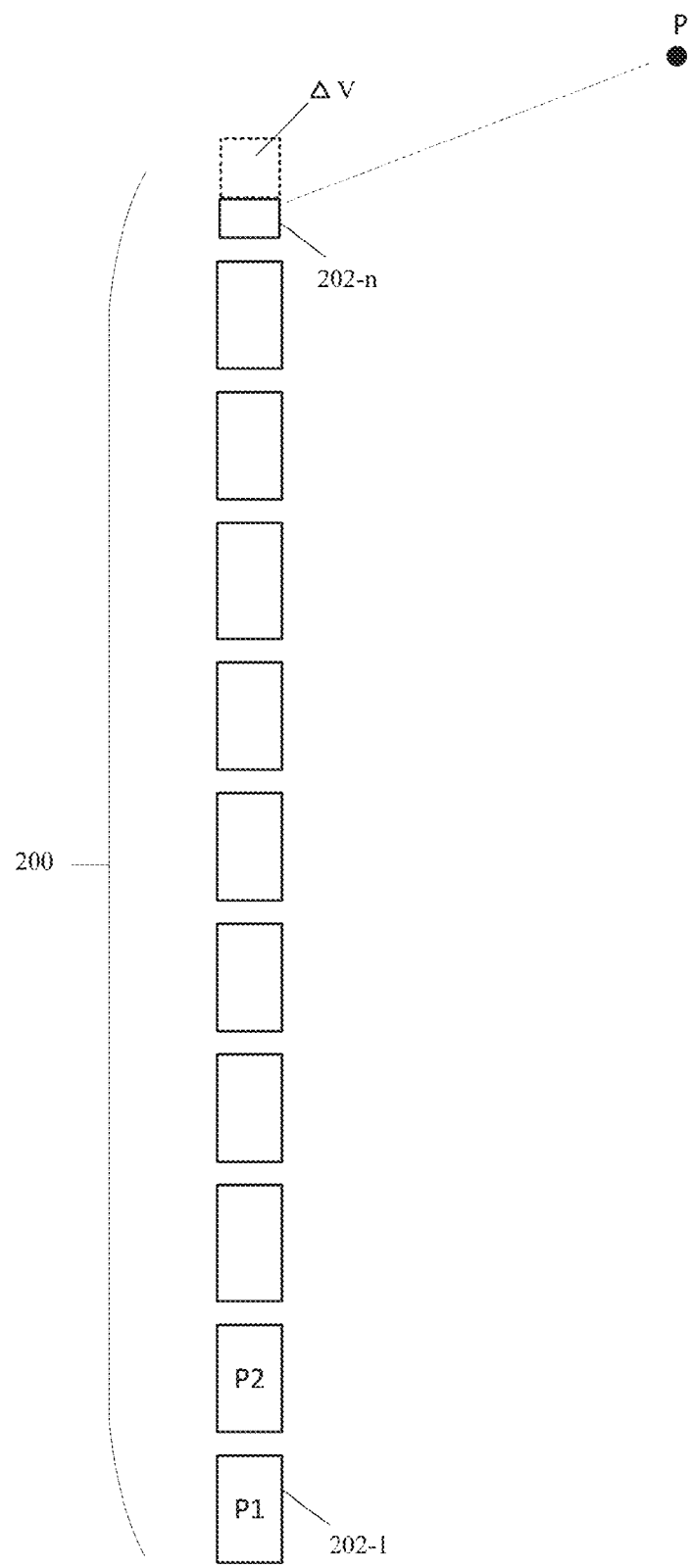
FIG. 2 shows of magnetic string in accordance with the described embodiments.

This same approach can be generalized to magnetic string 200 shown in FIG. 2 having n magnetic elements 202-1 through 202-n arranged in an alternating magnetic pattern (i.e., P1, P2, P1, etc.). Using Eq. (9), magnetic string 200 can be balanced in such as way as to provide a magnetic field at point P having a net magnetic field strength $H_1$ (P) equal to null by adjusting the volume of a magnetic element that is closest to point P. In this example, magnetic element 202-n having magnetic volume in accordance with Eq. (12);

$$0=V_m/x_m^3+\Sigma_1^{m-1}\pm V_i/x_i^3; \qquad \text{Eq. (12)}$$

$$V_m^*=\Sigma_1^{m-1}\pm V_i x_m^3/x_i^3; \qquad \text{Eq. (13)}$$

Since $x_m$ is less than any of $x_i$, then as with magnetic pair 100, magnetic string 200 can be balanced with respect to point P by reducing volume $V_m$, by $\Delta V_m$ to $V_m^*$.

Figure 3A:
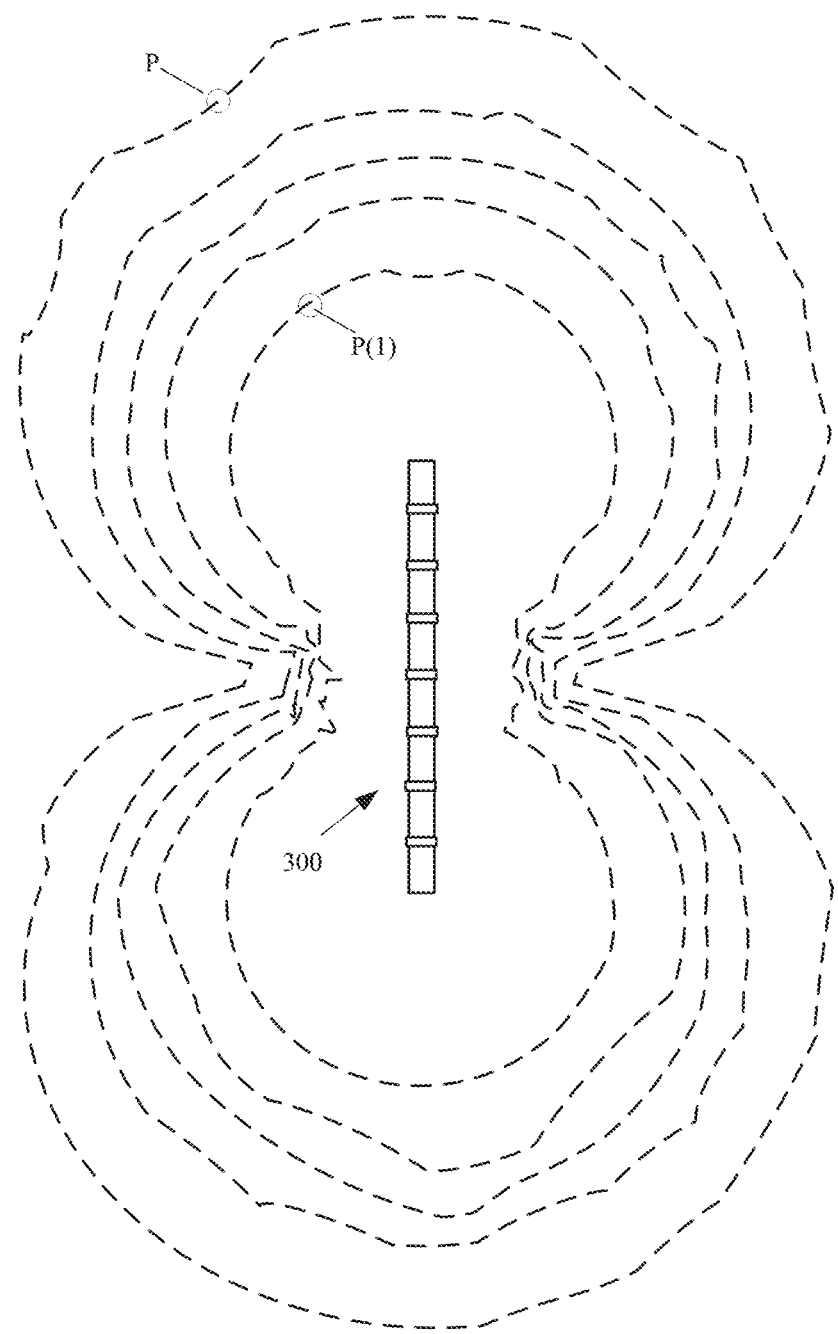
FIGS. 3A-3C shows simulation of a distribution of iso-contour lines of a magnetic field for various embodiments of balanced magnetic string.
Figure 3B:
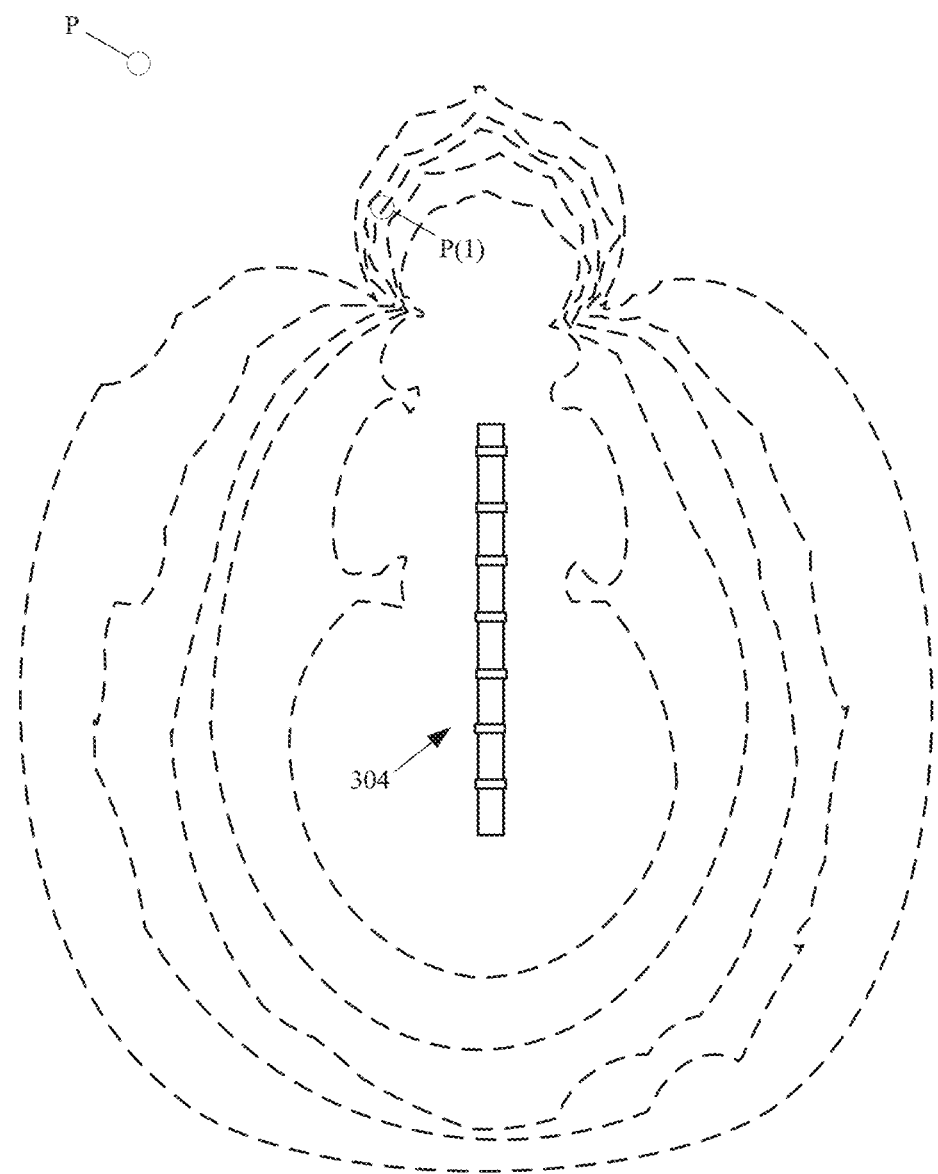
Figure 3C:
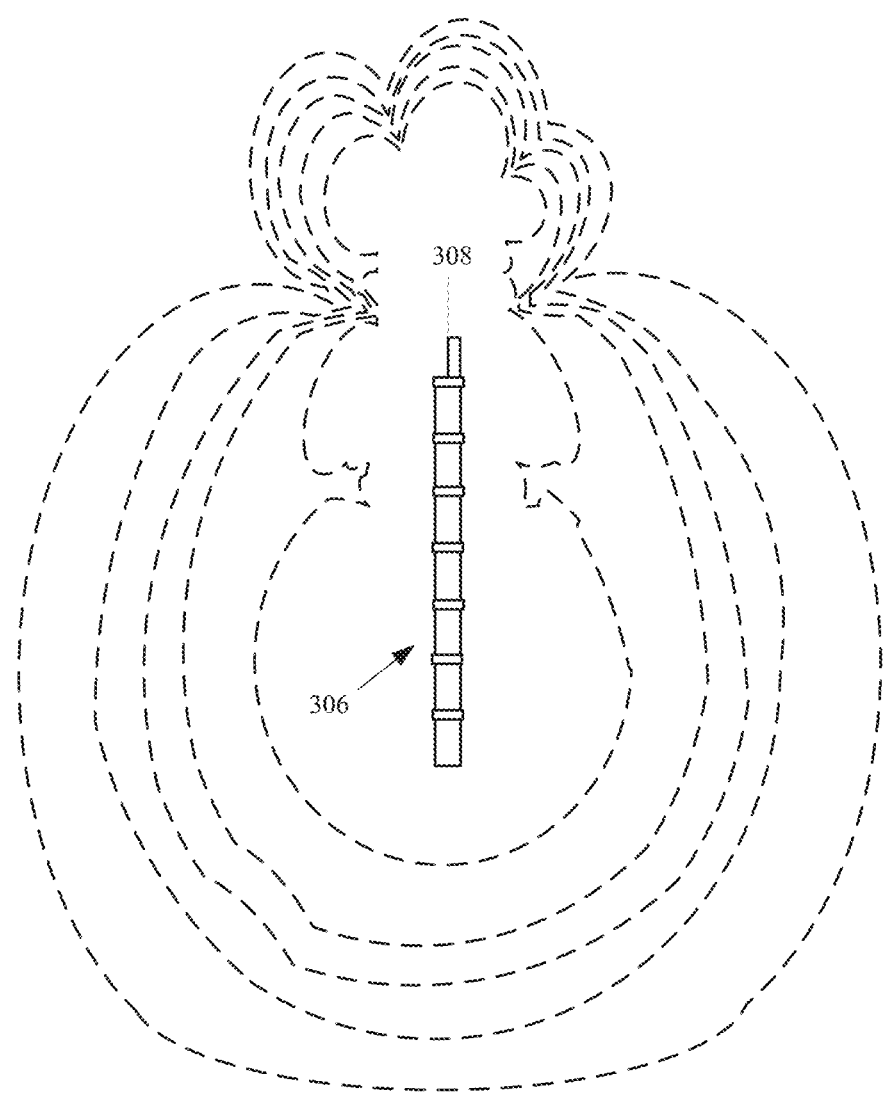

FIG. 3A shows simulation of a magnetic field provided by unbalanced magnetic string 300 in the form of iso-contour lines. As shown, each iso-contour line can represent a magnetic field strength generally described in terms of Tesla (T) or in this case, micro-Tesla (µT). More particularly, magnetic string 300 shown in FIG. 3A has 8 magnetic elements (i.e., 302-1 to 302-8), magnetic field strength H(p) at point P(1) can be on the order of about 25 µT whereas the magnetic field strength as point P can be on the order of 20 µT. However, as shown in FIG. 3B, shows balance magnetic string 304 form by balancing magnetic string 300 by, in this embodiment, reducing volume V of magnetic element 302-8 nearest point P (thereby having the greatest effect on the local magnetic properties associated with point P), magnetic field strength H(P) at point P can be substantially reduced to close to zero (0 µT). Moreover, FIG. 3C shows magnetic string 306 having 8 magnetic elements where modification of volume of magnetic element 306-8 can be carried out by removing magnetic material closest to point P (i.e., material on the side of a centerline 308 of magnetic element 306-8 is removed).

Figure 4:
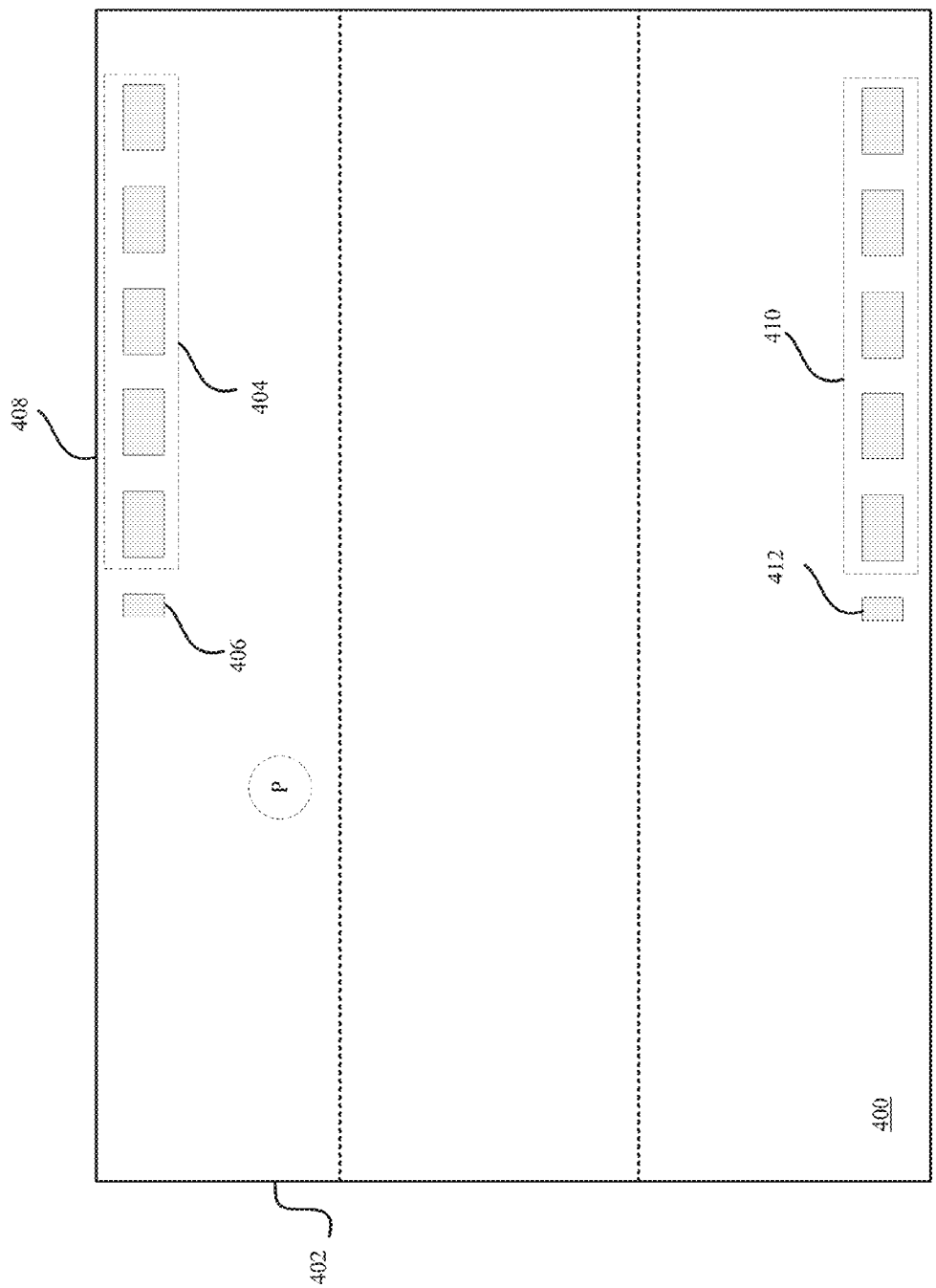
FIG. 4 shows an implementation of a protective cover having flap used to as an accessory for a tablet device.

FIG. 4 shows a top view of a specific embodiment of protective flap 400 used to protect a cover glass used to protect a display carried by an electronic device such as a tablet in accordance with the described embodiments. Flap 400 can include body 402 having a size and shape in accordance with the cover glass. Body 402 can be formed from a single piece of foldable or pliable material. Body 402 can also be divided into segments separated from each other by a folding region. In this way, the segments can be folded with respect to each other at the folding regions. In one embodiment, body 402 can include a number of magnets that are arranged in linear manner to form magnetic string 404. In one embodiment, magnetic string 404 can be balanced by the presence of compensating magnet 406. In one embodiment, compensating magnet 406 can be located at a position closest (i.e., shortest distance) in relation to point P. It should be noted that compensating magnet 406 is dual purpose and also provides additional attractive force.

In the described embodiment, point P can be associated with a location of a magnetically sensitive component (such as a magnetometer) disposed within and carried by the tablet device when flap 400 is fully contacting the cover glass in what can be referred to as a closed configuration. Accordingly, compensating magnet 406 can effectively counteract (or balance) the magnetic effects of magnetic string 404 in such a way as to provide a resultant magnetic field at point P having a desired magnetic characteristic (such as magnetic field strength). In some cases, the desired magnetic field strength can be null in that essentially all of the magnetic effects of magnetic string 404 can be balanced by compensating magnetic element 406.

In one embodiment, magnetic string 404 can take the form of edge attach magnets linearly arrayed along first edge 408 of body 402. Flap 400 can also include second magnetic string 410 having compensating magnet 412 in the form of second edge attach magnets linearly arrayed along second edge 414 opposite to first edge 408. In this embodiment, first edge attach magnets 404 and second edge attach magnets 410 can have a one to one correspondence in which each first edge attach magnet 404 can be associated with a corresponding one of second edge attach magnets 410. Moreover, in order to create a maximum magnetic attractive force between first edge attach magnets 404 and second edge attach magnets 410, each magnet pair can exhibit opposite magnetic polarities. For example, when first edge attach magnets 404 are arranged in first polarity pattern (alternating) $M_1$ {P1, P2, P1, P2, P1, P2, P1, P2}, then second edge attach magnets 410 can be arranged in complementary priority pattern $M_2$ {P2, P1, P2, P1, P2, P1, P2, P1}. In this way, a maximum magnetic attachment force can be realized between the two magnetic arrays while minimizing magnetic fringe effects at the ends of the magnetic arrays. Moreover, by balancing first and second edge attach magnets using the described techniques, unwanted effects to the magnetic field generated by the first and second edge attach magnets can be minimized. It should be noted that the described techniques equally apply to magnetic repelling/rejection forces.

Figure 5:
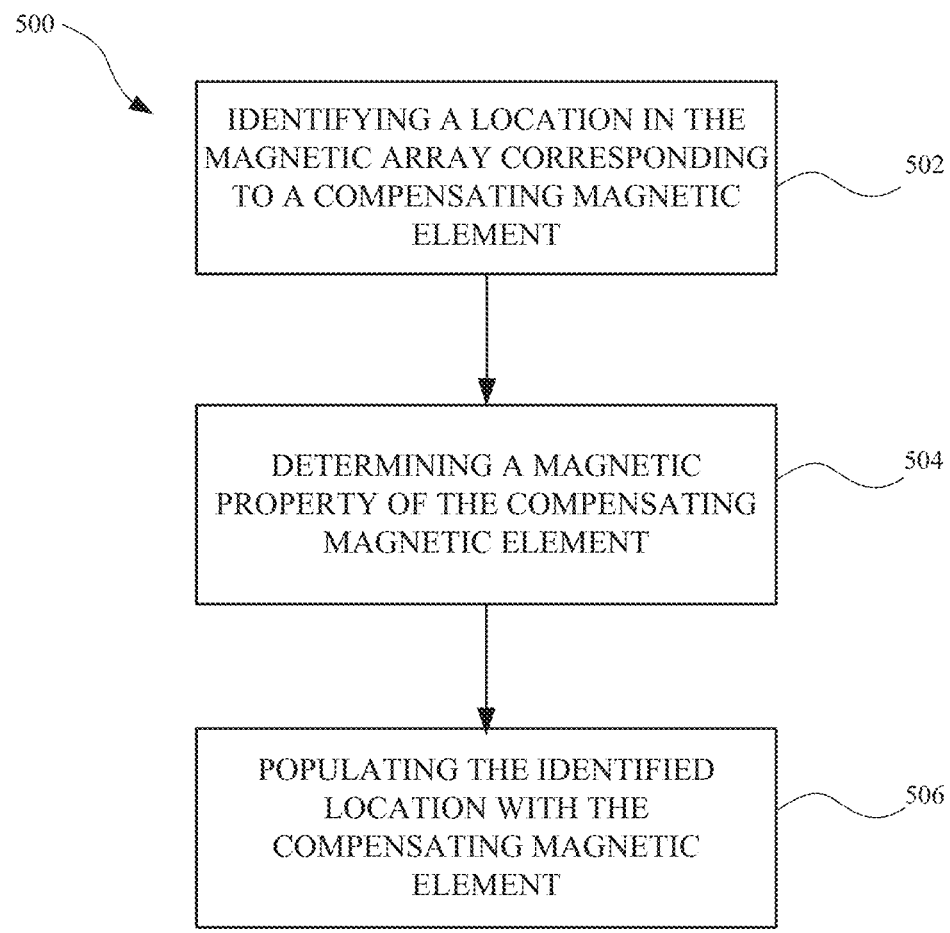
FIG. 5 shows a flow chart detailing process for balancing a magnetic array in accordance with the described embodiments.

FIG. 5 shows a flow chart detailing process 500 for forming a balanced magnetic array having m magnetic elements such that the balanced magnetic array provides a resultant magnetic field having a desired magnetic field strength H with respect to a point of interest. Process 500 can begin at 502 identifying a location in the magnetic array corresponding to a compensating magnetic element. At 504, determining a magnetic property of the compensating magnetic element such that a magnetic interaction between the compensating magnetic element and the m−1 other magnetic elements in the magnetic array provides the resultant magnetic field having a desired magnetic property at a point of interest. At 506, populating the identified location with the compensating magnetic element.

Figure 6:
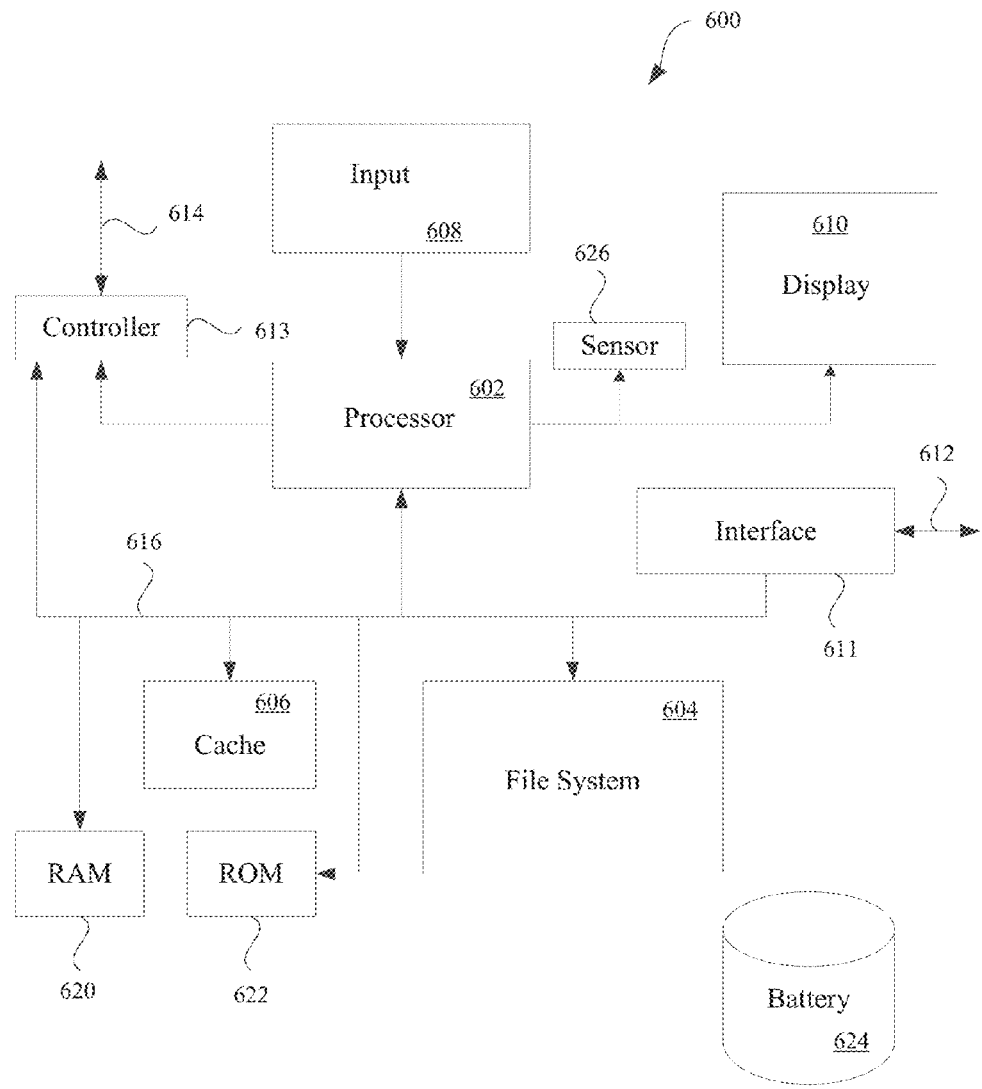
FIG. 6 shows a block diagram of a computing system in accordance with the described embodiments.

FIG. 6 is a block diagram of an electronic device suitable for controlling some of the processes in the described embodiment. Electronic device 600 can illustrate circuitry of a representative computing device. Electronic device 600 can include a processor 602 that pertains to a microprocessor or controller for controlling the overall operation of electronic device 600. Electronic device 600 can include instruction data pertaining to manufacturing instructions in a file system 604 and a cache 606. File system 604 can be a storage disk or a plurality of disks. In some embodiments, file system 604 can be flash memory, semiconductor (solid state) memory or the like. The file system 604 can typically provide high capacity storage capability for the electronic device 600. However, since the access time to the file system 604 can be relatively slow (especially if file system 604 includes a mechanical disk drive), the electronic device 600 can also include cache 606. The cache 606 can include, for example, Random-Access Memory (RAM) provided by semiconductor memory. The relative access time to the cache 606 can substantially shorter than for the file system 604. However, cache 606 may not have the large storage capacity of file system 604. Further, file system 604, when active, can consume more power than cache 606. Power consumption often can be a concern when the electronic device 600 is a portable device that is powered by battery 624. The electronic device 600 can also include a RAM 620 and a Read-Only Memory (ROM) 622. The ROM 622 can store programs, utilities or processes to be executed in a non-volatile manner. The RAM 620 can provide volatile data storage, such as for cache 606.

Electronic device 600 can also include user input device 608 that allows a user of the electronic device 600 to interact with the electronic device 600. For example, user input device 608 can take a variety of forms, such as a button, keypad, dial, touch screen, audio input interface, visual/image capture input interface, input in the form of sensor data, etc. Still further, electronic device 600 can include a display 610 (screen display) that can be controlled by processor 602 to display information to the user. Data bus 616 can facilitate data transfer between at least file system 604, cache 606, processor 602, and controller 613. Controller 613 can be used to interface with and control different manufacturing equipment through equipment control bus 614. For example, control bus 614 can be used to control a computer numerical control (CNC) mill, a press, or other display devices. For example, processor 602, upon a certain manufacturing event occurring, can supply instructions to control an alternate display through controller 613 and control bus 614. Such instructions can be stored in file system 604, RAM 620, ROM 622 or cache 606.

Electronic device 600 can also include a network/bus interface 611 that couples to data link 612. Data link 612 can allow electronic device 600 to couple to a host computer or to accessory devices. The data link 612 can be provided over a wired connection or a wireless connection. In the case of a wireless connection, network/bus interface 611 can include a wireless transceiver. Sensor 626 can take the form of circuitry for detecting any number of stimuli. For example, sensor 626 can include any number of sensors for monitoring such as, for example, a Hall Effect sensor responsive to external magnetic field, an audio sensor, a light sensor such as a photometer, computer vision sensor to detect clarity, a temperature sensor to monitor a molding process and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

A balanced magnetic string includes at least a plurality of magnetic elements linearly arranged in an alternating magnetic polarity pattern and each having a first magnetic volume. The magnetic string also includes a compensating magnetic element having a second magnetic volume that is different than the first magnetic volume. The plurality of magnetic elements and the compensating magnetic element magnetically interact to provide a resultant magnetic field having a desired magnetic field strength at a point of interest. In one embodiment, the balanced magnetic string is disposed within a flap used to protect an outer protective layer carried by an electronic device.

A balanced magnetic system includes at least first magnetic elements and second magnetic elements, wherein the first and second magnetic elements are arranged with respect to each other such that the first and second magnetic elements interact in such a way that a resultant magnetic field at a common point of interest comprises a null magnetic field value, wherein the null magnetic field value is maintained when an attenuation and/or gain resulting from the magnetic interaction cancel out each other.

A protective cover suitable for attachment to and protection of an aspect of an electronic device having a magnetically sensitive component includes a flap having a size and shape in accordance with the aspect of the electronic device is described. The balanced magnetic array is disposed within the flap and arranged to generate a magnetic field having a pre-determined magnetic field strength at a point of interest.

A balanced magnetic array having m magnetic elements such that the balanced magnetic array provides a resultant magnetic field having a desired magnetic field strength H with respect to a point of interest P is described. The balanced magnetic array includes a compensating magnetic element at an identified location in the magnetic array, the compensating magnetic element comprising a magnetic property such that a magnetic interaction between the compensating magnetic element and m−1 other magnetic elements in the magnetic array provides the resultant magnetic field.

The advantages of the embodiments described are numerous. Different aspects, embodiments or implementations can yield one or more of the following advantages. Many features and advantages of the present embodiments are apparent from the written description and, thus, it is intended by the appended claims to cover all such features and advantages of the invention. Further, since numerous modifications and changes will readily occur to those skilled in the art, the embodiments should not be limited to the exact construction and operation as illustrated and described. Hence, all suitable modifications and equivalents can be resorted to as falling within the scope of the invention.

What is claimed is:

1. A balanced magnetic array having m magnetic elements, comprising:
    a linear array of magnetic elements corresponding to a magnetic string comprising:
    m−1 magnetic elements, arranged in an alternating magnetic pattern wherein each of the m−1 magnetic elements comprises a magnetic volume Vm and each located a distance $x_i$ from a point of interest; and
    an $m^{th}$ magnetic element comprising a magnetic property such that a magnetic interaction between the $m^{th}$ magnetic element and the m−1 other magnetic elements in the magnetic string provides a resultant magnetic field having a desired magnetic field strength H at the point of interest, wherein the $m^{th}$ magnetic element corresponds to a compensating magnetic element cm located at a position in the magnetic string corresponding to a shortest distance $x_{cm}$ to the point of interest and having a volume Vcm such that the desired magnetic field strength $H = V_{cm}/x_{cm}^3 + \Sigma_1^{m-} \pm V_i/X_i^3$.

2. The balanced magnetic array as recited in claim 1, wherein when the desired magnetic field strength H is null, then the volume Vm of the compensating magnetic element is in accordance with $V_{cm} = \Sigma_1^{m-1} \pm V_i x_{cm}^3 / x_i^3$; where $X_{cm} < X^i$.

3. The balanced magnetic array as recited in claim 2, wherein the balanced magnetic array is disposed in a flap pivotally attachable to an electronic device comprising a magnetically sensitive component.

4. The balanced magnetic array as recited in claim 3, wherein the point of interest corresponds to a location on the flap that corresponds to the magnetically sensitive component carried by the electronic device when the flap is fully contacting the electronic device.

5. A balanced magnetic system, comprising:
an arrangement of magnetic elements that interact with each other to generate a magnetic field at a point of interest that is maintained in accordance with a magnetic interaction between the magnetic elements, the arrangement of magnetic elements comprising:
m magnetic elements, comprising:
m−1 magnetic elements, arranged in an alternating magnetic pattern wherein each of the m−1 magnetic elements comprises a magnetic volume Vm and each located a distance $x_i$ from the point of interest, and
an $m^{th}$ magnetic element comprising a magnetic property such that a magnetic interaction between the $m^{th}$ magnetic element and the m−1 other magnetic elements provides a resultant magnetic field having a desired magnetic field strength H at the point of interest, wherein the $m^{th}$ magnetic element corresponds to a compensating magnetic element cm located at a position corresponding to a shortest distance $x_{cm}$ to the point of interest and having a volume Vcm such that the desired magnetic field strength $H = V_{cm}/x_{cm}^3 + \Sigma_1^{m-1} \pm V_i/x_i^3$.

6. The balanced magnetic system as recited in claim 5, wherein when the desired magnetic field strength is null when the magnetic interaction between the magnetic elements cancel each other out.

7. The balanced magnetic system as recited in claim 6, wherein the desired magnetic field strength is null when the volume of the compensating magnetic element is in accordance with $V_{cm} = \Sigma_1^{m-1} \pm V_i x_{cm}^3 / x_i^3$; where $x_{cm} < x_i$.

8. The balanced magnetic system as recited in claim 5, wherein the balanced magnetic system is disposed within a flap attachable to an electronic device arranged to carry a magnetically sensitive circuit.

9. The balanced magnetic system as recited in claim 8, wherein the point of interest corresponds to a location on the flap corresponding to the magnetically sensitive circuit when the location is fully contacting the electronic device.

10. The balanced magnetic system as recited in claim 5, wherein the m magnetic elements form a linear array of magnetic elements corresponding to a magnetic string.

11. The balanced magnetic system as recited in claim 10, wherein magnetic elements are arranged in an alternating magnetic pattern.

* * * * *